US010343946B2

(12) United States Patent
Wolff et al.

(10) Patent No.: US 10,343,946 B2
(45) Date of Patent: Jul. 9, 2019

(54) HIGHLY REFRACTIVE THIN GLASSES

(71) Applicant: SCHOTT AG, Mainz (DE)

(72) Inventors: Silke Wolff, Hueckeswagen (DE); Simone Ritter, Mainz (DE); Gunther Paulus, Mainz (DE); Ute Wölfel, Mainz (DE); Peter Brix, Mainz (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 14/798,982

(22) Filed: Jul. 14, 2015

(65) Prior Publication Data
US 2015/0315066 A1 Nov. 5, 2015

Related U.S. Application Data
(63) Continuation-in-part of application No. 13/882,011, filed as application No. PCT/EP2011/068637 on Oct. 25, 2011.

(30) Foreign Application Priority Data

Oct. 26, 2010 (DE) .......................... 10 2010 042 945
Jul. 14, 2014 (DE) .......................... 10 2014 109 831

(51) Int. Cl.
| C03C 3/097 | (2006.01) |
| C03C 3/064 | (2006.01) |
| C03C 3/066 | (2006.01) |
| C03C 3/062 | (2006.01) |
| C03C 3/068 | (2006.01) |
| H01L 51/52 | (2006.01) |
| H01L 51/00 | (2006.01) |

(52) U.S. Cl.
CPC .............. C03C 3/062 (2013.01); C03C 3/064 (2013.01); C03C 3/066 (2013.01); C03C 3/068 (2013.01); C03C 3/097 (2013.01); H01L 51/0096 (2013.01); H01L 51/5275 (2013.01); Y02E 10/549 (2013.01); Y02P 70/521 (2015.11)

(58) Field of Classification Search
CPC ......... C03C 3/062; C03C 3/066; C03C 3/064; C03C 3/068; C03C 3/097; H01L 51/0096; H01L 51/5275
See application file for complete search history.

(56) References Cited

U.S. PATENT DOCUMENTS

| 4,179,300 A | 12/1979 | Sagara |
| 4,227,936 A | 10/1980 | Osswald et al. |
| 4,526,874 A | 7/1985 | Grabowski geb. Marszalek et al. |
| 4,682,019 A | 7/1987 | Nakatsui et al. |
| 4,732,876 A | 3/1988 | Nagamine et al. |
| 4,812,423 A | 3/1989 | Kodama et al. |
| 6,163,110 A * | 12/2000 | Arai .................... H01L 51/5262 313/503 |
| 6,333,288 B1 | 12/2001 | Clement et al. |
| 6,630,420 B1 | 10/2003 | Naumann et al. |
| 2002/0006857 A1 | 1/2002 | Tachiwama |
| 2003/0092555 A1 | 5/2003 | Wolff et al. |
| 2004/0124771 A1 | 7/2004 | Sundahl et al. |
| 2005/0000564 A1 | 1/2005 | Sato et al. |
| 2006/0043402 A1 | 3/2006 | Suehiro et al. |
| 2007/0170846 A1 | 7/2007 | Choi et al. |
| 2007/0184964 A1 | 8/2007 | Peuchert et al. |
| 2007/0190338 A1* | 8/2007 | Aitken .................... C03B 17/02 428/432 |
| 2008/0029710 A1 | 2/2008 | Sekiya et al. |
| 2008/0149863 A1 | 6/2008 | Rodriguez Cuartas et al. |
| 2008/0231972 A1 | 9/2008 | Hachitani et al. |
| 2009/0233782 A1 | 9/2009 | Sasai |
| 2010/0079387 A1 | 4/2010 | Rosenblatt et al. |
| 2011/0278635 A1 | 11/2011 | Nakamura et al. |
| 2012/0114904 A1 | 5/2012 | Yanase et al. |
| 2013/0276880 A1 | 10/2013 | Wolff et al. |
| 2014/0284577 A1 | 9/2014 | Mennemann et al. |

FOREIGN PATENT DOCUMENTS

| CN | 1396132 | 2/2003 |
| CN | 101009309 A | 8/2007 |
| DE | 2808223 | 9/1979 |
| DE | 3216451 A1 | 11/1983 |
| DE | 4101365 | 4/1992 |
| DE | 19631580 | 11/1997 |

(Continued)

OTHER PUBLICATIONS

English translation of the International Preliminary Report on Patentability dated Apr. 30, 2013 for corresponding PCT/EP2011/068637, 17 pages.
Lu, M.-H, et al., "External coupling efficiency in planar organic light-emitting devices" Applied Physics Letters, American Institute of Physics, vol. 78, No. 13, Mar. 26, 2001, pp. 1927-1929.
Schott AG, Optical Glass, Data Sheets, Inquiry Glass, Feb. 2, 2014, 29 pages.
Schott AG, Optical Glass, Data Sheets, Apr. 15, 2015, 130 pages.
Yokoyama, D., et al., "Horizontal orientation of linear-shaped organic molecules having bulky substituents in neat an doped vacuum-deposited amorphous films," Organic Electronics, 2009, pp. 127-137.
Saxena, K., et al., "A review on the light extraction techniques in organic electroluminescent devices," Optical Materials, 2009, pp. 221-233.

(Continued)

Primary Examiner — Golam Mowla
(74) Attorney, Agent, or Firm — Ohlandt, Greeley, Ruggiero & Perle, L.L.P.

(57) ABSTRACT

Glass sheets with high refractive indexes (nd), layer composite assemblies including the glass sheets, methods for manufacturing the glass sheets, and methods of using the glass sheets are all provided. The glass sheets can be processed in a glass sheet manufacturing process and nevertheless have the optical properties of a classical optical glass. The glass sheets of the are highly transparent, resistant to crystallization, chemically resistant and highly refractive. The glass sheets have a viscosity-temperature behavior that is adapted to the manufacturing procedure with glass sheet manufacturing processes.

14 Claims, No Drawings

(56) References Cited

FOREIGN PATENT DOCUMENTS

| | | |
|---|---|---|
| DE | 10005088 C1 | 3/2001 |
| DE | 10133763 C1 | 8/2002 |
| DE | 102006062092 A1 | 7/2008 |
| DE | 102009011507 A1 | 9/2010 |
| DE | 102010023619 A1 | 2/2011 |
| DE | 102013102848 B3 | 2/2014 |
| DE | 112012002137 T5 | 3/2014 |
| EP | 2048915 A1 | 4/2009 |
| EP | 2452926 A1 | 5/2012 |
| FR | 2937798 A1 | 4/2010 |
| GB | 2251854 | 7/1992 |
| JP | S55126549 A | 9/1980 |
| JP | S5918131 | 1/1984 |
| JP | S61232243 | 10/1986 |
| JP | H09208250 | 8/1997 |
| JP | H1167444 A | 3/1999 |
| JP | H11135819 A | 5/1999 |
| JP | 2002537206 | 11/2002 |
| JP | 2004-2062 | 1/2004 |
| JP | 2005330181 | 12/2005 |
| JP | 2006016293 | 1/2006 |
| JP | 2008537291 A | 9/2008 |
| JP | 2008233547 | 10/2008 |
| JP | 2009203134 A | 9/2009 |
| JP | 2010033851 | 2/2010 |
| JP | 2010040448 | 2/2010 |
| JP | 2010-118505 | 5/2010 |
| JP | 2010154769 | 7/2010 |
| JP | 2010215463 | 9/2010 |
| JP | 2011213568 A | 10/2011 |
| WO | 2005085147 A1 | 9/2005 |
| WO | 2006109222 A1 | 10/2006 |
| WO | 2006129256 A2 | 12/2006 |
| WO | 2008032742 | 3/2008 |
| WO | 2009154314 A1 | 12/2009 |
| WO | 2010084924 | 7/2010 |
| WO | 2010099249 A1 | 9/2010 |
| WO | 2010138698 A2 | 12/2010 |
| WO | 2010138784 A2 | 12/2010 |
| WO | 2011/004844 | 1/2011 |
| WO | 2012055860 A2 | 5/2012 |

OTHER PUBLICATIONS

Rosenow, T.C., et al., "Highly efficient white organic light-emitting diodes based on fluorescent blue emitters," Journal of Applied Physics, 2010, 6 pp.

English translation of International Search Report dated May 22, 2012 corresponding to International Patent Application No. PCT/EP2011/068637, 4 pages.

English translation of Written Opinion dated May 22, 2012 corresponding to International Patent Application No. PCT/EP2011/068637, 16 pages.

* cited by examiner

HIGHLY REFRACTIVE THIN GLASSES

CROSS REFERENCE TO RELATED APPLICATIONS

This application is a continuation-in-part of U.S. application Ser. No. 13/882,011 filed on Jul. 12, 2013, which is a National Stage of International Application No. PCT/EP2011/068637 filed on Oct. 25, 2011, which claims the benefit of German Application No. 10 2010 042 945.7 filed on Oct. 26, 2010, and this Application claims the benefit of German Application No. 10 2014 109 831.5 filed on Jul. 14, 2014, the contents of all of which are incorporated by reference herein.

BACKGROUND

1. Field of the Invention

This invention relates to thin glasses having a high refractive index (nd), a layer composite comprising these thin glasses, a method for the production of the thin glasses and their uses.

2. Description of Related Art

Glasses having refractive indexes in the range of above nd=1.5 up to nd=1.7 are well known. In the field of technical glasses, however, they are achieved by the addition of high amounts of lead oxide which is questionable from an ecological point of view and also disadvantageous for large economic processes. Known conventional optical glasses with optical positions in the range of high refractive indexes which are used for light- and image-conducting purposes and thus are used in the conventional application fields (i.a. imaging, microscopy, medical engineering, digital projection, photolithography, optical communications engineering, optics/lighting in the automotive field) are normally prepared as a bulk material due to the geometry of the products which are subsequently produced therefrom (i.a. lenses, prisms, fibers). Ingot sections in the case of continuous ingot manufacturing, fiber core glass rods as well as optical blocks are standard formats of the production process of optical glasses. Minimum dimensions in the direction of the smallest geometric extent, normally the thickness (ingot sections) or the diameter (fiber core glass rods), of 20 mm are considered as economically and applicatively reasonable, but desirable are thicknesses of higher than 40 mm and optical blocks are available only from about 150 mm.

Typically, technical glasses (prepared according to technical hot forming methods) have refractive indexes of about 1.50. Generally, glasses having refractive indexes of >1.6 are hardly suitable for technical hot forming methods, since most often they have a "steep" viscosity curve (strong change of viscosity with temperature, i.e. "short" glass properties) and most often a high tendency to crystallization. In the case of technical hot forming methods, compared to the production of ingots, these properties are a problem, since the residence time in the large technical aggregates is considerably longer and thus also the pre-nucleation/nucleation time. In addition, the technical hot forming methods are associated with longer process times and larger process intervals, so that the correspondingly longer times allow the nucleuses to develop into crystals.

Therefore, there is a difference with respect to the tendency to crystallization and the steepness of the viscosity curve between the conventional optical glasses and the technical standard glasses, the physicochemical property profiles of which are specifically tailor-made for the technical basic conditions of the manufacturing aggregates of technical glasses, i.e. flat, thin and tube glasses, which are significantly larger in comparison to the manufacturing aggregates of optical glasses.

Normally, technical glasses have a "long" viscosity profile, which means that their viscosity does not vary that strongly with changing temperatures. From that, longer times of the respective single processes result, and also generally increased process temperatures result, which in the case of the large technical aggregates has a less distinctive negative influence onto the profitability. Furthermore, there are significantly longer residence times of the materials in the aggregates due to the flow conditions and the size of the aggregates. The residence time in the large technical aggregates is considerably longer and thus also the pre-nucleation/nucleation times are longer. In addition, the technical hot forming methods are associated with longer process times, so that the correspondingly longer times allow the nucleuses to develop into crystals. This is an extremely critical point for glasses with a high tendency to crystallization. Long glasses are advantageous in continuous large aggregates, because these glasses can be processed within a larger temperature range. Thus it is not necessary that the process is geared towards a processing of the still hot glass which is conducted as quickly as possible.

If it was considered to produce conventional optical materials in a flat glass manufacturing method (e.g. drawing, overflow fusion, down drawn, rolling), then the chemical composition of the optical glasses has to be changed in a such manner, that the content of those components must be changed (normally reduced) which are responsible for the desired optical properties of the optical glasses. Such measures would be, for example, the reduction of the proportions of $TiO_2$, $ZrO_2$, $Nb_2O_5$, BaO, CaO, ZnO, SrO or $La_2O_3$. This indeed results in longer glasses with reduced tendency to crystallization, but also in a considerable loss of refractive index and dispersion properties.

This is aggravated by the fact that the flat/thin glass processes which are currently preferred due to economic reasons are associated with certain chemical requirements for the glasses to be processed which are not fulfilled by the conventional optical glasses: For example, in a floating process it is not allowed for redox-sensitive components to be present in the glass. Thus, for example, standard optical components, such as the oxides of lead, bismuth, tungsten as well as the conventional polyvalent refining agents (arsenic), the effective action of which is exactly based on the shift of the redox equilibrium, cannot be used.

Thus, in total there is a contradicting difference between these two conventional groups of material, the optical glasses and the technical glasses, with respect to their processability.

There are numerous uses for thin glasses having a high refractive index besides the conventional application fields. Of course, there is the possibility to produce such thin glasses by cold reprocessing of an ingot of optical glass. But it is obvious that the cutting and polishing steps of such ingot sections are extremely expensive, and in addition they stress the glass very strongly. Thus, in this manner very small thicknesses together with large dimensions cannot be achieved. When thin glasses are mechanically polished, then this results in surface conditions which are not optimal.

GB 2,447,637 B relates to an OLED layer composite which can be used for lighting or display purposes. But here a substrate glass having a refractive index of only about 1.5 is used. The disadvantages being connected therewith have to be weakened by an antireflection layer.

US 2012/194,064 A1 describes a diffusion layer for OLEDs. The glass used there contains very much $Bi_2O_3$ and very little $SiO_2$ and BaO. The same belongs to US 2011/287,264 A1.

Especially for the use as a substrate and/or superstrate in an OLED or a photovoltaic module it is important that between a flat glass and an adjacent layer no or only little total reflection occurs. The refractive index of the glass used should be as high as possible. Because there are many uses in layer composites in which the glass is adjacent to a layer with high refractive index, such as for example ITO in OLEDs. When the light which is generated in the OLED is emitted, then the light from the ITO layer has to enter into the superstrate of glass. The larger the difference of the refractive index between the ITO layer and the glass, the more distinctive is the total reflection at the interface. Thus, here economically produced thin glasses with high refractive index can be used in a very advantageous manner.

SUMMARY

It is the object of this invention to provide a thin glass which can be processed in a flat glass manufacturing method and at the same time is characterized by the optical properties of a conventional optical glass. In other words: the glass should combine the processability of a technical glass with the optical properties of an optical glass.

The thin glasses of this invention are highly transparent, resistant against crystallization, chemically resistant and highly refractive. Their viscosity-temperature behavior is adapted to the production process with flat glass manufacturing methods.

DETAILED DESCRIPTION

The glass of this invention is a flat glass, in particular a flat glass with low thickness of preferably lower than 2 mm (hereinafter "thin glass"). The thin glasses according to the present invention differ from conventional optical glasses not only in their thicknesses, but also in their surface conditions. This is connected with the production methods with which they can be obtained. In an attempt of producing classical optical glasses with thicknesses of 2 mm or lower, certain problems would occur according to the selected production process. As described above, due to the shortness of the glasses and their tendency to crystallization it would not be possible to achieve a satisfactory result with the flat glass manufacturing methods. But when however it would be tried to produce the glasses from ingot sections by cutting and polishing, then this on the one hand would increase the costs, and on the other hand surface conditions would be achieved which would hardly fulfil the requirements of the glass. The thin glasses of this invention have refractive indexes of >1.60, preferably >1.65, more preferably >1.67, more preferably >1.69, more preferably >1.70, still more preferably >1.72 and particularly preferably >1.74.

The thin glasses of this invention can be produced with flat glass manufacturing methods because their compositions. Preferable flat glass manufacturing methods are selected from the group comprising discontinuous flat glass manufacturing methods, continuous flat glass manufacturing methods, inline flat glass manufacturing methods and combinations thereof. Particularly preferable flat glass manufacturing methods are selected from the group comprising continuous flat glass manufacturing methods, inline flat glass manufacturing methods and combinations thereof.

Preferable flat glass manufacturing methods in the sense of this invention are in particular redrawing, down draw, overflow fusion, floating and rolling. Particularly preferable are down draw and overflow fusion. With these manufacturing methods thin glasses with special surface conditions can be produced. Due to the manufacturing methods with which they can be obtained, the thin glasses have preferably at least one, in particular two fire-polished surfaces. Fire-polished surfaces are extremely smooth, i.e. they show only low roughness. In contrast to mechanical polishing, in the case of fire-polishing a surface is not ground, but the material to be polished is heated to such a high temperature so that it flows, which results in a smooth surface condition. Therefore, the costs for the production of a smooth surface by fire-polishing are substantially lower than the costs for the production of a very smooth mechanically polished surface. Particularly preferable flat glass manufacturing methods are down draw and overflow fusion.

With the flat glass manufacturing methods according to the present invention preferably thin glasses with at least one fire-polished surface are obtained. When a down draw or overflow fusion process is used for the production, then the glasses obtained preferably comprise even two fire-polished surfaces.

With respect to the thin glass according to the present invention "surfaces" means the upper and/or lower sides, thus both areas which are the largest in comparison to the remaining areas.

Fire-polished surfaces are characterized by a particularly low roughness. The roughness of a fire-polished surface is lower than that of a mechanically polished surface.

The fire-polished surface(s) of the thin glasses of this invention preferably has/have a root-mean-squared roughness (Rq or also RMS) of at most 5 nm, preferably at most 3 nm and particularly preferably at most 1 nm. The roughness depth Rt of the thin glasses is preferably at most 6 nm, more preferably at most 4 nm and particularly preferably at most 2 nm. The roughness depth can be determined according to DIN EN ISO 4287.

In the case of mechanically polished surfaces the roughness values are worse. In addition, in the case of mechanically polished surfaces polishing traces can be seen with the help of an atomic force microscope (AFM). Furthermore, with the help of the AFM also residues of the mechanical polishing agent, such as diamond powder, iron oxide and/or CeO2, can be seen. Since mechanically polished surfaces after polishing always have to be cleaned, this results in leaching of certain ions at the surface of the glass. This depletion of certain ions can be detected with secondary ion mass spectrometry (ToF-SIMS). Such ions are for example Ca, Zn, Ba and alkali metals.

The thin glass of this invention has preferably a thickness of lower than 2 mm, more preferably at most 0.8 mm and more preferably at most 0.6 mm. Particularly preferably, the thickness is at most 0.35 mm and in particular at most 0.2 mm. Such a thin glass is characterized by sufficient elasticity for allowing e.g. flexible OLED layer composites. For guaranteeing sufficient stability, the thickness should preferably be at least 0.02 mm. Generally, thicknesses of for example 15 µm, 30 µm, 50 µm, 70 urn, 100 µm, 0.2 mm, 0.21 mm, 0.3 mm, 0.4 mm, 0.55 mm, 0.7 mm, 0.9 mm, 1.0 mm, 1.1 mm, 1.2 mm or 2.0 mm are preferable, wherein in these cases a plurality of uses is possible.

So that the thin glasses of this invention can be produced in flat glass manufacturing methods, with respect to their crystallization properties they should be characterized by certain parameters. These parameters are not that important in the case of conventional optical glasses, since in the production of conventional optical glasses the risk of crystallization is considerably reduced due to short nucleation times during the melting process, short residence times in the aggregates and short process intervals resulting from the shortness of the glasses. Thus, the optical glasses, after a short pre-nucleation or no pre-nucleation at all, are quickly cooled down from a temperature above the upper devitrification limit (OEG, liquidus temperature) to a temperature below the lower devitrification limit (UEG), so that they very quickly pass the range of crystal growth after little pre-nucleation, and no crystallization in the hot forming process results.

But during the processing with flat glass manufacturing methods the glasses are subjected to a relatively high temperature for a longer period of time. Therefore, for the crystallization resistance it is particularly important that the thin glasses according to the present invention have an OEG which is as low as possible, for achieving a difference between the hot processing temperature (VA) and the OEG which is as high as possible.

Therefore, the thin glasses according to the present invention should have such a resistance against crystallization that they do not show any or any visible crystals even in the case, when they, after increasing the temperature, are subjected to temperatures of 800° C. to 1050° C. (OEG/55) during a period of 55 minutes. This test is conducted in a calibrated gradient furnace according to the Pt carrier plate method. According to the present invention, visible crystals are crystals with a diameter of higher than 10 μm.

For the thin glasses of this invention a relative low amount of $SiO_2$ is sufficient. On the one hand, $SiO_2$ is an important component in the glass, since it makes the viscosity curve less steep. But on the other hand, when much $SiO_2$ is used, only relatively lower amounts of components can be added which effectively can increase the refractive index. Therefore, the thin glasses of this invention only contain up to 52% by weight, preferably only up to 50% by weight, more preferably up to 48% by weight, still more preferably up to 45% by weight of $SiO_2$. Nevertheless, the thin glasses of this invention have to fulfil certain requirements with respect to chemical stability and steepness of the viscosity curve, so that at least 20% by weight, preferably at least 25% by weight, more preferably at least 28% by weight, still more preferably at least 30% by weight of $SiO_2$ are contained in the thin glass.

The component BaO is a substantial constituent of the thin glasses according to the present invention. BaO supports the high refractive index. For this purpose BaO is preferably contained in the thin glass according to the present invention in a proportion of at least 2% by weight. More preferably, the content of BaO is even at least 5% by weight, still more preferably at least 7% by weight and particularly preferably at least 9% by weight. But proportions which are too high can reduce the chemical resistance and increase the tendency to crystallization of the glasses, which has to be avoided by all means in the manufacturing methods which are preferred according to the present invention. Therefore, the content of BaO is limited to at most 14.5% by weight, preferably at most 14% by weight, still more preferably at most 12% by weight.

An important criterion with respect to the desired refractive index and the required crystallization stability is a balanced ratio of the components BaO and $SiO_2$ in the thin glass according to the present invention. This ratio of BaO to $SiO_2$ is a ratio of the proportions by weight and is preferably at least 0.05 and most 0.75, more preferably at least 0.1 and at most 0.5.

For increasing the refractive index of the thin glasses and for improving the chemical stability of the thin glasses, $TiO_2$ is an essential constituent of the thin glasses according to the present invention. In the thin glasses according to the present invention $TiO_2$ is contained in a content of higher than 12% by weight, preferably at least 12.5% by weight, more preferably at least 13% by weight, still more preferably at least 14% by weight, particularly preferably at least 15% by weight. But when $TiO_2$ is used in too high amounts, then the tendency to crystallization of the glasses is increased. Therefore, the thin glasses according to the present invention contain $TiO_2$ in a proportion of at most 32% by weight, preferably at most 30% by weight, more preferably at most 28% by weight, still more preferably at most 25% by weight.

An important criterion with respect to the desired refractive index and the required crystallization stability is a balanced ratio of the components BaO and $TiO_2$ in the thin glass according to the present invention. $TiO_2$ results in a much higher increase of the refractive index than BaO. For achieving a refractive index which is high enough, therefore the ratio of the proportions by weight of BaO to $TiO_2$ is preferably not higher than 2. But $TiO_2$ increases the OEG of the glass in contrast to BaO which decreases the OEG. For guaranteeing a sufficient crystallization resistance of the glass, therefore the ratio of the proportions by weight of BaO to $TiO_2$ in the glasses according to the present invention is at least 0.1. Preferably, the ratio of BaO to $TiO_2$ is at least 0.2 and at most 1.4, more preferably at least 0.5 and at most 1.2.

An important criterion with respect to the desired refractive index and the required "long" viscosity profile is a balanced ratio of the components $SiO_2$ and $TiO_2$. $TiO_2$, in contrast to $SiO_2$, results in an increase of the refractive index of the glass. For achieving a refractive index which is sufficiently high, therefore the ratio of the proportions by weight of $SiO_2$ to $TiO_2$ is preferably not higher than 7. However, $TiO_2$, in contrast to $SiO_2$, results in a "shorter" viscosity profile. For achieving a sufficiently "long" viscosity profile, therefore the ratio of the proportions by weight of $SiO_2$ to $TiO_2$ is preferably at least 0.7. Particularly preferably, the ratio of the proportions by weight of $SiO_2$ to $TiO_2$ is at least 1.5 and at most 4.

The proportion of $Nb_2O_5$ of the thin glasses according to the present invention is at least 0.5% by weight, preferably at least 1% by weight, still more preferably at least 2% by weight, particularly preferably at least 5% by weight, especially preferably at least 8% by weight. $Nb_2O_5$ can be used for the adjustment of the high refractive indexes which are required according to the present invention. But it has to be considered that the amounts in which these components are used have to be limited, because otherwise the tendency to crystallization would increase too much. Therefore, the proportion of $Nb_2O_5$ in the thin glasses according to the present invention is preferably at most 26% by weight, more preferably at most 25% by weight, still more preferably at most 23% by weight, particularly preferably at most 20% by weight, especially preferably at most 15% by weight.

One optional component is $La_2O_3$ which is preferably used in a content of 0 to 7% by weight. Preferably, the thin glasses according to the present invention contain $La_2O_3$ in a proportion of at least 0.1% by weight, more preferably at least 0.5% by weight, still more preferably at least 1% by weight. Preferably, the thin glasses according to the present invention contain $La_2O_3$ in a proportion of at most 5% by weight, more preferably at most 4% by weight, still more preferably at most 2% by weight. $La_2O_3$ can be used for the adjustment of the high refractive indexes which are required according to the present invention. But it has to be considered that the amounts in which this component is used have to be limited, because otherwise the tendency to crystallization would increase too much. Preferable embodiments are even free of $La_2O_3$.

The thin glasses of this invention may contain $B_2O_3$, preferably in a proportion of at most 17% by weight. In preferable embodiments the amount of this component is limited to at most 15% by weight, more preferably at most 12% by weight, still more preferably at most 10% by weight. When the proportion of $B_2O_3$ in the preferred glass is too low, then the viscosity of the glass becomes too high. The thin glasses of the present invention contain $B_2O_3$ preferably in a proportion of at least 1% by weight, more preferably at least 2% by weight, still more preferably at least 4% by weight, particularly preferably at least 5.5% by weight. But when on the other hand a too high amount of $B_2O_3$ is used, then the required chemical resistance cannot be achieved. This is a critical point for the processability of the glass e.g. in the semiconductor process (e.g. cleaning step). In addition, high proportions of $B_2O_3$ in the glass increase the corrosion and thus the introduction of the refractory material into the melt during the production of the glass. This results in inhomogeneity, scattering, heterogeneous nucleuses and crystallization again. Particularly preferable embodiments are even free of $B_2O_3$.

$B_2O_3$ is a glass former like $SiO_2$; it is advantageous, when the content of $SiO_2$ and $B_2O_3$ is selected such that the sum of $SiO_2$ and $B_2O_3$ does not fall below a value of 20% by weight, more preferably 25% by weight, more preferably 30% by weight, particularly preferably 33% by weight. When the sum of the contents of $SiO_2$ and $B_2O_3$ is too low, then such a glass would show a tendency to crystallization and would have a poor chemical resistance. Preferably, the sum of the contents of $SiO_2$ and $B_2O_3$ is at most 55% by weight, more preferably at most 50% by weight, more preferably at most 49% by weight, more preferably at most 46% by weight, still more preferably at most 45% by weight, particularly preferably at most 40% by weight. When the sum of the contents of $SiO_2$ and $B_2O_3$ is too high, then glasses with a refractive index which is too low are obtained.

In contrast to $SiO_2$, $B_2O_3$ results in reduced melting temperatures of the glasses according to the present invention. But an increased proportion of $B_2O_3$ decreases the chemical resistance of the material. Therefore, for achieving a sufficient chemical resistance, the ratio of the proportions by weight of $B_2O_3$ to $SiO_2$ in the glasses according to the present invention is preferably at most 0.75, more preferably at most 0.5.

$Al_2O_3$ results in increased melting temperatures of the glass which results in increased energy consumption and reduced working lives of the aggregates. The thin glass according to the present invention preferably contains an amount of $Al_2O_3$ which is lower than 1.5% by weight, more preferably lower than 1% by weight, still more preferably lower than 0.5% by weight, particularly preferably lower than 0.1% by weight. Especially preferable embodiments of the present invention are even free of $Al_2O_3$.

Especially in combination with $B_2O_3$, $Li_2O$ can strongly attack the production facilities (corrosion) which results in material removal (glass breakthrough), turbidity, heterogeneous nucleation and short working lives of the aggregates. In addition, $Li_2O$ results in increased mobility of the crystal growth components in the glass so that the tendency to crystallization of the glass is increased. In addition, the chemical resistance of the glass is reduced. Therefore, the thin glasses according to the present invention are preferably free of $Li_2O$.

The thin glasses according to the present invention may comprise $K_2O$. $K_2O$ serves for the precise adjustment of the viscosity. The proportion of $K_2O$ of the thin glasses according to the present invention is preferably at least 0.5% by weight, more preferably at least 1% by weight, still more preferably at least 2% by weight, particularly preferably at least 4% by weight. But a proportion of $K_2O$ of the glass which is too high results in increased mobility and low chemical resistance. Preferably, $K_2O$ is contained in the glass in amounts of up to 15% by weight, more preferably up to 10% by weight, still more preferably up to 8% by weight, still more preferably up to 6% by weight.

The thin glasses according to the present invention may comprise $Na_2O$. $Na_2O$ serves for the precise adjustment of the viscosity. The proportion of $Na_2O$ of the thin glasses according to the present invention is preferably at least 0.5% by weight, more preferably at least 1% by weight, still more preferably at least 2% by weight, particularly preferably at least 5% by weight. But a proportion of $Na_2O$ of the glass which is too high results in increased mobility and low chemical resistance. In addition, the tendency to crystallization of the glasses is considerably increased by a proportion of $Na_2O$ which is too high. Therefore, the proportion of Na2O of the thin glasses according to the present invention is at most 11% by weight, preferably at most 10% by weight, still more preferably at most 8.5% by weight, particularly preferably at most 7% by weight. Preferable embodiments are even free of $Na_2O$.

$Na_2O$ and $K_2O$ serve for the precise adjustment of the viscosity. The proportion of the sum of $Na_2O$ and $K_2O$ of the glass is preferably at least 3% by weight, more preferably at least 5% by weight, still more preferably at least 7% by weight. But a proportion of $Na_2O$ and $K_2O$ which is too high results in increased mobility and low chemical resistance. Therefore, the proportion of the sum of $K_2O$ and $Na_2O$ of the glass is preferably at most 23% by weight, more preferably at most 20% by weight, still more preferably at most 17% by weight.

A proportion of $Na_2O$ of the glass which is too high results in increased mobility and thus in increased tendency to crystallization. But the increased mobility which is attributed to the proportion of $Na_2O$ which is too high can be reduced by $K_2O$ (antagonism). Therefore preferably, the proportion by weight of $K_2O$ of the glasses according to the present invention is at least as high as, more preferably even higher than the respective proportion by weight of $Na_2O$. Preferably, the ratio by weight of $K_2O$ to $Na_2O$ is at least 1, more preferably higher than 1, more preferably higher than 1.2, still more preferably higher than 1.5.

The thin glasses according to the present invention may comprise MgO. MgO is used for adjusting the viscosity of the glass. Preferably, its content is up to 5% by weight, more preferably up to 2% by weight. When too much MgO is used, then the viscosity of the material becomes too low. In addition, glasses which are "too short" can be obtained. Therefore, preferable embodiments are free of MgO.

The thin glasses may comprise SrO. But when too much SrO is used, then glasses which are too short are obtained. In addition, the use of SrO is associated with high costs. Therefore, the proportion of SrO of the thin glasses according to the present invention is at most 1% by weight, preferably at most 0.5% by weight, still more preferably at most 0.2% by weight, particularly preferably at most 0.1% by weight. Especially preferable embodiments are even free of SrO.

When the proportion of SrO is too high, then the glasses are too short, which, as described above, in particular has a negative influence onto the processability of the glasses in the flat glass method. This negative effect occurs in particular in the case, when the glasses already have increased melting temperatures, which predominantly result from a content of $Al_2O_3$ which is too high. Therefore, the sum of the proportions of $Al_2O_3$ and SrO of the thin glasses according to the present invention is preferably lower than 2% by weight, more preferably lower than 1.5% by weight, still more preferably lower than 1% by weight, particularly preferably lower than 0.5% by weight.

The thin glasses of this invention may contain CaO for adjusting the dependency of the viscosity on the temperature. For this purpose CaO is used in amounts of preferably up to 15% by weight, more preferably up to 10% by weight, still more preferably up to 7% by weight, particularly preferably up to 5% by weight. When too much CaO is used, then a glass which is too short is obtained. Preferable embodiments contain at least 0.5% by weight, more preferably at least 1% by weight, still more preferably at least 2% by weight of CaO.

The thin glasses according to the present invention may contain ZnO. ZnO serves for the adjustment of the viscosity of the glass and for the reduction of the tendency to crystallization. Preferably, the content of ZnO is at most 6% by weight, preferably at most 5% by weight, more preferably at most 4% by weight, still more preferably at most 2% by weight. The content of ZnO should not be too high, because otherwise the glasses may become too "short".

For optimally adjusting the "length" of the glass, the proportion by weight of the sum of the oxides BaO, SrO, CaO, MgO and ZnO together should preferably not exceed a value of 15% by weight.

For increasing the refractive index of the thin glass, $ZrO_2$ can be used. In this case the content of $ZrO_2$ in the glasses according to the present invention is preferably 0 to 7% by weight. Preferably, the glasses according to the present invention contain $ZrO_2$ in a proportion of at most 5% by weight, more preferably at most 4% by weight. When the amount of $ZrO_2$ used is too high, the tendency to crystallization of the glasses is increased by increased nucleation. In particularly preferable embodiments at least 1% by weight of $ZrO_2$ is used. With the addition of $ZrO_2$ also the chemical stability is improved.

The highly refractive components $TiO_2$, $ZrO_2$ and $Nb_2O_5$ can be used for increasing the refractive index of the thin glasses according to the present invention. But however, when these components are used in too high amounts, then the tendency to crystallization of the glasses is too high. Surprisingly it was found that also the ratio by weight of the sum of $ZrO_2$ and $Nb_2O_5$ to $TiO_2$ has an influence onto the tendency of crystallization of the glasses. Preferably, this ratio should by lower than 2, more preferably lower than 1.75, still more preferably lower than 1.5, still more preferably lower than 1.4, still more preferably lower than 1.3, still more preferably lower than 1.2, still more preferably lower than 1.1, especially preferably at most 1.0.

A ratio by weight of fluxing agents to glass formers which is too low results in poor melting of the glass and in an increased tendency to crystallization of the glass. According to the present invention, fluxing agents are the alkali oxides $Li_2O$, $Na_2O$ and $K_2O$. According to the present invention, glass formers are $SiO_2$, $B_2O_3$, $P_2O_5$, $As_2O_3$, $GeO_2$ and $Sb_2O_5$. Preferably, the ratio of fluxing agents to glass formers is at least 0.1, more preferably at least 0.15, still more preferably at least 0.2, particularly preferably at least 0.3. But the ratio should also not be too high. Preferably, the ratio is at most 0.8, more preferably at most 0.6, still more preferably at most 0.5.

In addition, it was also shown, that also the ratio by weight of the sum of the fluxing agents and the highly refractive components $TiO_2$, $ZrO_2$ and $Nb_2O_5$ to the glass formers has an influence onto the tendency to crystallization of the thin glasses according to the present invention. Preferably, this ratio should be higher than 0.7, more preferably higher than 0.8, still more preferably higher than 1. But this ratio should also not be too high. Preferably, this ratio is at most 1.8, more preferably at most 1.6, still more preferably at most 1.5.

The glasses of the present invention may contain $Ta_2O_5$. $Ta_2O_5$ results in a very good crystallization resistance of the glasses according to the present invention. Preferably, the content of $Ta_2O_5$ is at least 1% by weight, more preferably at least 2% by weight. But $Ta_2O_5$ increases the price of the glass very strongly. Therefore, the glasses according to the present invention preferably do not contain more than 8% by weight, more preferably more than 5% by weight of $Ta_2O_5$. Therefore, particular embodiments of the present invention are even free of $Ta_2O_5$.

The glasses of the present invention may contain $GeO_2$. $GeO_2$ results in a very good crystallization resistance of the glasses according to the present invention. Preferably, the content of $GeO_2$ is at least 1% by weight, more preferably at least 2% by weight. But $GeO_2$ increases the price of the glass very strongly. Therefore, the glasses according to the present invention preferably do not contain more than 8% by weight of $GeO_2$, more preferably more than 5% by weight. Therefore, particular embodiments of the present invention are even free of $GeO_2$.

When in this description is mentioned that the glasses are free of a component or that the glasses do not contain a special component, then this means, that this component is only allowed to be present as an impurity in the glasses. This means that it is not added or contained in substantial amounts. According to the present invention, not substantial amounts are amounts of lower than 1000 ppm, preferably lower than 500 ppm and most preferably lower than 100 ppm. Preferably, the thin glasses according to the present invention are free of components which are not mentioned in this description as a glass constituent. In particular, the thin glasses of this invention are preferably free of PbO, because PbO is a component which is not friendly to the environment and health. Furthermore, the glass is preferably free of $Bi_2O_3$, because this component strongly increases the tendency to crystallization and the raw material costs of the glasses and decreases the transmittance. Preferably, the glass does not contain $Fe_2O_3$, because $Fe_2O_3$ decreases the transmittance. Preferable embodiments of the present invention are free of $Y_2O_3$, $P_2O_5$ and F—.

In addition, the common refining agents such as in particular $SnO_2$, $Sb_2O_3$, sulfates and/or chlorides can be added to the thin glass for refining. $As_2O_3$ may also be added, but preferably this component is not added due to toxicological and environmentally detrimental reasons.

As mentioned above, the glasses according to the present invention are characterized by relatively low melting and hot processing temperatures. The hot processing temperatures (VA) of the glasses according to the present invention are preferably lower than 1000° C., more preferably in a range of 800° C. to 1000° C. and particularly preferably in a range of 820° C. to 970° C. Low processing temperatures protect the aggregates and thus increase the profitability of the production.

According to the present invention, the melting temperatures (Tm) of the glasses—expressed in temperatures at which the glasses have a viscosity of 102 dPas—are preferably in a range of at least 850° C. and at most 1250° C., more preferably in a range of at least 900° C. and at most 1150° C.

The glass-transition temperatures (Tg) of the glasses according to the present invention are preferably in a range of higher than 500° C., more preferably higher than 550° C., more preferably higher than 600° C. and preferably lower than 750° C., more preferably lower than 700° C.

The thin glasses of this invention are preferably prepared in a flat glass method. The method according to the present invention comprises the following steps: melting of a glass mixture comprising the following components in % by weight

|  | from | to |
|---|---|---|
| $SiO_2$ | 20 | 52, |
| BaO | 2 | 14.5, |
| $TiO_2$ | >12 | 32, |
| $Nb_2O5$ | 0.5 | 26, |
| $Na_2O$ | 0 | 11, and |
| SrO | 0 | 1, and | processing of the glass melt or the glass obtained from the glass melt into a thin glass.

The processing of the glass melt or of the glass obtained from the glass melt into a thin glass is preferably conducted in a flat glass manufacturing method. In the sense of this invention, flat glass manufacturing methods are preferably redrawing, down draw, overflow fusion, floating and rolling. Preferably, the flat glass manufacturing methods are down draw or overflow fusion. Other methods such as floating and rolling are also possible, but they are not preferable due to the tendency to a worse glass surface. If the glass should be floated, then in addition redox-specific properties of certain components have to be considered. Therefore, this hot forming process is not preferred. In alternative embodiments redrawing is a preferable flat glass manufacturing method. Redrawing preferably allows for the production of small batch sizes of the thin glass according to the present invention. Other flat glass manufacturing methods are more suitable for the production of larger batch sizes. In addition, redrawing preferably allows a more variable change of the glass.

The flat glass methods according to the present invention are preferably so-called inline methods, during which the thin glass is molten and immediately thereafter it is formed. An inline method is in particularly characterized by the fact that the glass melt in the molten state is further processed without any cooling step before. Thus, in inline methods the thin glass is not at first cast into ingots and then further processed, but directly after the melting step it is formed into a thin glass. In alternative embodiments of the present invention the flat glass manufacturing methods are preferably not inline methods.

Preferable flat glass manufacturing methods are the down draw and the overflow fusion methods as well as the redrawing method. The down draw method is described in WO 02/051757 A2 and the overflow fusion method is described in WO 03/051783 A1.

In the down draw method a glass melt which flows from a drawing tank through a nozzle, optionally using a guide body, is formed into a ribbon of glass which is drawn down by laterally arranged rolls to the desired thickness and width.

In the overflow fusion method a glass melt is guided into an overflow tank from which the glass melt flows over the edges of at least two sides (overflow). Both ribbons of the down-flowing glass melt flow down along the walls of the overflow tank and combine (fusion) at the lower part of the tapered walls to a ribbon of glass.

In both methods the glass melt is kept and moved in a liquid state for a relatively long time. Therefore, the risk of crystallization is relatively high. Thus, the aspect of crystallization has to be considered in a particular way. Another important aspect is the temperature-viscosity profile of the glasses. The processing can be conducted in a much better fashion, when the glasses with decreasing temperature do not become too viscous within a too short period of time and when the processing temperature is not too high. The glasses of this invention are characterized by these properties, which results in a more stable configuration of the process as well as in a considerably increased working life of the production apparatuses used (drawing tanks, overflow fusion channel, etc.).

In alternative embodiments the redrawing method is a preferable flat glass manufacturing method. In a redrawing step a piece of glass is partially heated and drawn in the longitudinal direction with the help of suitable mechanical production facilities. When glasses are redrawn, normally an oblong blank is fixed on one side in a holder and is heated at the other end. When the glass becomes deformable, it is drawn by applying a tensile force onto the end of the blank which is fixed in the holder. In a redrawing step from a blank having a width B and a thickness D a thin glass having a width b and a thickness d is prepared. Preferably, the ratio b/d is higher than the ratio B/D.

For a redrawing step even higher requirements with respect to the crystallization resistance of the processed glasses than for other flat glass manufacturing methods have to be fulfilled, since for a longer period of time parts of the blank have to be kept at a temperature which allows crystal growth. In addition, during the production process the glass of the blank has already once passed the range of crystal growth so that already increased nucleuses may be present in the glass, which support an accelerated crystallization. Therefore, conventional optical glasses are hardly suitable for redrawing due to their low crystallization resistance. Furthermore, for redrawing glasses should be characterized by an especially "long" viscosity profile. Thus, in the case of smaller fluctuations of the temperature the viscosity should only change slightly, so that a redrawing step can be conducted under viscosity conditions which are as constant as possible. Otherwise, this may result in a considerably lower quality of the redrawn glass, in particular because of undesired fluctuations of the thickness of the glass.

The thin glass of the present invention is preferably characterized by the high crystallization resistance which is advantageous for redrawing. The thin glass of the present invention is preferably characterized by the "long" viscosity profile which is advantageous for redrawing.

Preferably, the redrawability of the glass can be improved by redrawing parameters according to the present invention.

In order to prevent crystallization, according to the present invention it is preferable that the height of the deformation zone of the blank is as small as possible. So it can be achieved that temperature ranges which allow crystallization are passed very quickly. The deformation zone is the part of the glass blank in which the blank has a thickness of between 0.95*D and 1.05*d. Thus, it is a region in which the glass can be deformed. In the deformation zone the thickness of the blank is smaller than the original thickness D, but the final thickness d is still not achieved. The deformation zone of the blank can for example reach a deformation temperature at which the glass has a viscosity of between 104 dPas and 108 dPas. The height of the deformation zone is preferably at most 6*D (in particular at most 100 mm), more preferably at most 5*D (in particular at most 40 mm) and particularly preferably at most 4*D (in particular at most 30 mm).

The heating of the deformation zone of the blank to the deformation temperature is preferably achieved with the help of a heating facility. The heating facility may preferably be an electrical resistance heater, a burner arrangement, a radiation heater, a laser with or without laser scanner or a combination of them. A small deformation zone can preferably be obtained in that the heating facility comprises shields which shadow those parts of the blank which should not be heated. In an alternative or in addition, a heating facility can be used which allows focused heating of the blank, such as for instance a laser or a laser scanner. A further alternative embodiment relates to a heating facility which itself has only a low height and is arranged near the deformation zone so that the heat does not substantially advance into regions which should not be heated. In addition, a cooling facility may be provided which is preferably arranged directly behind the heating facility. The cooling facility further decreases the height of the deformation zone because the blank is cooled very quickly. So preferably directly after the deformation step the viscosity of the glass is increased to a value of >109 dPas so that no substantial deformation can take place any longer. This cooling step is preferably conducted such that a viscosity change rate of at least 106 dPas/s results. So the glass can be quickly cooled down to temperatures below the range of deformation and crystal growth.

It is particularly preferable that the heating facility is a laser with or without laser scanner, preferably a laser with laser scanner. As described above, the focused heating of the blank with a laser allows a deformation zone which is as small as possible. Furthermore, with a laser the incorporation of heat into the glass can be adjusted in a particularly exact manner. Thus, with a laser the temperature of the deformation zone can be adjusted in a particularly exact manner. With a laser temperature-related fluctuations of the viscosity can be minimized so that thin glass with lower variability of the thickness of the glass can be obtained.

With high frequency the laser can be directed over the width of the blank and so its power can be changed in accordance with the heat input to be achieved. The light energy contained in the laser beam can be dosed and focused very finely so that it can be absorbed directly from the blank in small selectable regions. The design of the temperature profile may be made finer and the influence onto the blank can be effected in smaller regions, i.e. with a higher resolution, which finally results in an improvement of the quality of the drawn thin glass. In this case the amount of added heat is preferably controlled by the correspondingly selected power of the laser beam.

The frequency of the laser beam with which the laser beam is swayed over the width of the blank can be selected so high that this results in a virtually stable heat input. In addition, a more exact dosing of the light energy becomes possible. All this has an advantageous influence onto the quality of the drawn thin glass. Preferably, the frequency of the laser beam is higher than 5 kHz, more preferably higher than 8 kHz, still more preferably higher than 10 kHz, particularly preferably higher than 12 kHz, especially preferably higher than 15 kHz.

Preferably, the laser beam is generated by a CO2 laser having a wave length in a range of 9 µm to 12 µm, more preferably having a wave length in a range of 10 µm to 11 µm, particularly preferably having a wave length of about 10.6 µm. Preferably, the laser beam is moved over the blank by means of a scanner.

According to a preferable embodiment, the resolution of the selected heat input into the blank is stipulated such that the laser beam is generated by an optical system, the focus of which comes into effect in the blank with about 1 mm$^2$.

According to a preferable embodiment, in the case of the common drawing velocities of commercial flat glass manufacturing facilities the method is conducted such that the laser beam is directed over the width of 0.5 to 1 m of the blank at a drawing velocity of 0.3 to 10 m/min and a frequency of higher than 10 kHz.

Also a layer composite comprising at least one of the thin glasses of this invention is part of the present invention. Preferably, the layer composite is transparent or transparent towards at least one side.

The layer composite according to the present invention preferably comprises a semiconductor layer and two electrodes. In this case, one electrode can be a conductive transparent oxide layer (e.g. ITO) or also an electrode of silver nanowires which allow electrical conduction by their arrangement. Further preferably, the layer composite comprises a substrate or superstrate layer, wherein the substrate layer and/or the superstrate layer comprises or consists of the thin glass according to the present invention.

Since the thin glasses according to the present invention are normally extremely poor in alkali metal oxides, in a preferable embodiment of the layer composite between the thin glass and the semiconductor layer a blocking or barrier layer can be omitted. In the case of certain semiconductor layers this blocking layer is normally necessary for avoiding diffusion of alkali ions into the semiconductor layer. Alkali ions diffusing into the semiconductor layer may result in defects up to the complete failure of the system (e.g. in the case of uses in a TFT display).

Also a system with glass substrates on both sides of the layer composite is possible, which is particularly preferable in the case of transparent OLED lighting systems, or also for achieving a hermetical encapsulation of an OLED or PV system with the glass.

In preferable embodiments the layer composite is used for the construction of a light-generating OLED system.

A layer composite according to the present invention with the thin glass according to the present invention as a substrate or superstrate layer is generally in particularly suitable for all uses in which radiation such as e.g. visible light, UV, IR or other radiation should be guided through the system and one or more layers are characterized by an increased refractive index, wherein it is possible that reflections occur at the interface between the layer(s).

These are e.g. generally optical and in particular semiconductor uses e.g. OLED systems (as display and in particular also as illuminant for area lighting). Another semiconductor use is e.g. thin layer photovoltaic, particularly preferable organic thin layer PV.

In alternative embodiments the layer composites according to the present invention may also be used in solar modules or as solar modules. It is obvious, that with the help of the glasses used according to the present invention also for solar modules advantageous properties can be achieved in the layer composite, because also there the unhindered passage of light through a substrate glass is important. Thus, using the layer composites solar modules with improved efficiency can be obtained. Also in such solar modules the layer composite is used together with electrodes.

The thin glass according to the present invention can be produced by a flat glass manufacturing method. According to the present invention, "flat glass manufacturing method" preferably means a method which allows the production of glass with an aspect ratio (thickness to surface area, described below) of panes. These panes are characterized by minimum thicknesses of 0.02 mm (thinnest glasses) and also standard thicknesses of 0.1-1 mm, up to thicknesses of 3 mm. Preferably, the widths are between 0.1 to 3 m. The kind of the flat glass manufacturing method varies with the desired aspect ratio between the above-described preferred methods and related processes. Thus, the required thickness of the thin glass in the substrate layer is achieved. With conventional optical glasses having a refractive index of >1.6 these flat glass manufacturing methods cannot be conducted, because they contain components and/or have compositions which result in low crystallization stability of the glasses.

Preferably, the substrate layer in the layer composite has a layer thickness of lower than 3 mm. More preferably, this layer thickness is lower than 2 mm and particularly preferably lower than 1 mm or lower than 0.5 mm. In a preferable flexible form of the layer construction the layer thickness is preferably <500 μm, particularly preferably <200 μm. This is advantageous, because with decreasing thickness the elasticity of the glass increases. Thus, with increasing thickness the elasticity of the layer composite in total would decrease. But when the layer thickness is selected too low, then on the one hand the processability is hampered and on the other hand the resistance of the layer composite in total against damages is decreased. Therefore, the layer thickness of the substrate layer is preferably at least 0.03 mm and more preferably at least 0.05 mm. The advantageous elasticity of the thin glass is achieved by suitable selection of the ingredients.

Preferably, the layer composite is a constituent of an OLED lighting system (illuminant). The use of the glasses according to the present invention as substrate glasses for an OLED and/or in an OLED lighting system is part of this invention.

The use of a glass according to the present invention in the form of a thin glass as a substrate or superstrate, in particular in a layer composite with a semiconductor layer is part of this invention. Preferably, the use is a use in an above-described layer composite.

EXAMPLES

The following examples in Tables 1 and 2 show synthesis compositions of the thin glasses of this invention as well as some parameters which are characteristic for these glasses. The data are given in % by weight. It was possible to process all these example glasses into thin glasses of this invention with the help of flat glass manufacturing methods according to the present invention without any crystallization.

TABLE 1

|  | G01 | G02 | G03 | G04 | G05 | G06 | G07 | G08 | G09 |
|---|---|---|---|---|---|---|---|---|---|
| $SiO_2$ | 50.0 | 33.0 | 43.0 | 26.3 | 35.0 | 25.3 | 38.0 | 33.3 | 33.3 |
| $B_2O_3$ |  | 15.0 |  | 13.2 | 15.0 | 12.7 |  |  |  |
| $Na_2O$ | 5.0 | 5.0 | 9.0 | 5.0 | 5.0 | 10.0 | 5.0 | 5.0 | 5.0 |
| $K_2O$ | 10.0 | 10.0 | 1.0 | 5.0 | 5.0 | 10.0 | 5.0 | 10.0 | 10.0 |
| MgO |  | 5.0 |  |  |  |  |  | 4.5 | 5.0 |
| CaO | 0.5 | 5.0 | 5.0 | 0.5 | 5.0 | 0.5 | 0.5 | 0.5 | 5.0 |
| BaO | 5.0 | 5.0 | 5.0 | 5.0 | 8.0 | 14.5 | 14.5 | 5.0 | 5.0 |
| ZnO |  |  | 5.0 |  |  |  |  | 5.0 |  |
| $TiO_2$ | 15.0 | 15.0 | 15.0 | 15.0 | 15.0 | 15.0 | 30.0 | 15.0 | 24.7 |
| $ZrO_2$ |  |  |  |  |  | 5.0 | 5.0 |  | 5.0 |
| $Nb_2O_5$ | 14.5 | 2.0 | 2.0 | 15.0 | 2.0 | 2.0 | 2.0 | 6.7 | 2.0 |
| $La_2O_3$ |  |  | 5.0 | 5.0 | 5.0 |  |  | 5.0 | 5.0 |
| $Ta_2O_5$ |  |  | 5.0 | 5.0 |  | 5.0 |  |  | 5.0 |
| $GeO_2$ |  | 5.0 | 5.0 | 5.0 |  |  | 5.0 | 5.0 |  |
| $Sb_2O_3$ | 0.3 | 0.3 | 0.3 |  | 0.3 | 0.3 | 0.3 | 0.3 | 0.3 |
| nd | 1.66 | 1.64 | 1.68 | 1.73 | 1.67 | 1.67 | 1.76 | 1.70 | 1.73 |
| vd | 33.4 | 38.2 | 35.2 | 28.3 | 36.3 | 35.9 | 26.7 | 33.1 | 30.1 |
| α20/300 [ppm/K] | 8.3 | 9.3 | 8.5 | 7.8 | 8.1 | 11.2 | 8.4 | 9.4 | 10.1 |
| Tg [° C.] | 621 | 538 | 599 | 538 | 581 | 494 | 616 | 596 | 587 |
| Tm [° C.] | 1247 | 944 | 1138 | 987 | 1018 | 885 | 1096 | 1076 | 1025 |

TABLE 2

|  | G10 | G11 | G12 | G13 | G14 | G15 | G16 | G17 | G18 |
|---|---|---|---|---|---|---|---|---|---|
| $SiO_2$ | 33.3 | 25.0 | 33.3 | 25.3 | 33.3 | 42.1 | 45.8 | 45.3 | 48.2 |
| $B_2O_3$ |  | 8.3 |  | 10.2 |  |  |  |  | 0.1 |
| $Na_2O$ | 9.0 | 10.0 | 5.0 | 9.0 | 5.0 | 5.3 | 5.0 | 4.3 | 0.7 |
| $K_2O$ | 1.0 | 10.0 | 7.0 | 1.0 | 5.0 | 4.8 | 5.0 | 5.7 | 9.4 |
| MgO | 5.0 |  |  | 5.0 |  |  |  |  | 0.1 |
| CaO | 5.0 |  | 5.0 | 4.5 | 10.5 | 5.5 | 2.9 | 5.0 | 3.2 | 3.3 |
| BaO | 5.0 | 5.0 | 5.0 | 5.0 | 5.0 | 9.7 | 7.7 | 7.8 | 8.2 |
| ZnO |  | 5.0 | 5.0 | 4.5 |  |  |  |  | 0.3 |
| $TiO_2$ | 15.0 | 16.7 | 24.0 | 25.0 | 30.0 | 19.7 | 24.1 | 19.4 | 20.6 |
| $ZrO_2$ | 5.0 |  | 5.0 |  | 5.0 | 1.7 |  | 4.9 | 1.0 |

TABLE 2-continued

|  | G10 | G11 | G12 | G13 | G14 | G15 | G16 | G17 | G18 |
|---|---|---|---|---|---|---|---|---|---|
| $Nb_2O_5$ | 15.0 | 15.0 | 6.2 | 2.0 | 6.2 | 10.2 | 3.3 | 3.7 | 2.5 |
| $La_2O_3$ |  |  |  | 2.5 |  |  |  | 0.3 |  |
| $Ta_2O_5$ | 1.7 |  | 5.0 |  | 5.0 | 3.6 | 4.1 | 5.0 | 5.0 |
| $GeO_2$ | 5.0 |  |  |  |  |  |  | 0.4 | 0.6 |
| $Sb_2O_3$ | 0.3 | 0.3 | 0.3 | 0.3 | 0.3 | 0.3 | 0.3 | 0.3 | 0.3 |
| Nd | 1.75 | 1.71 | 1.77 | 1.76 | 1.81 | 1.73 | 1.71 | 1.70 | 1.68 |
| Nd | 30.3 | 31.2 | 27.3 | 30.0 | 24.6 | 29.3 | 29.9 | 31.2 | 31.9 |
| α20/300 [ppm/K] | 8.7 | 11.5 | 8.6 | 9.7 | 8.2 | 7.8 | 7.8 | 7.3 | 6.9 |
| Tg [° C.] | 625 | 487 | 606 | 549 | 649 | 641 | 628 | 657 | 665 |
| Tm [° C.] | 1077 | 867 | 1077 | 919 | 1090 | 1180 | 1133 | 1251 | 1311 |

What is claimed is:

1. A thin glass having a refractive index of higher than 1.60, comprising the following components in % by weight:

|  | From | to |
|---|---|---|
| $SiO_2$ | 20 | 52 |
| BaO | 2 | 14.5 |
| $TiO_2$ | >12 | 32 |
| $Nb_2O_5$ | 0.5 | 26 |
| $Na_2O$ | 0 | 11 |
| SrO | 0 | 1, and | wherein the thin glass has a thickness of lower than 2 millimeters and comprises at least one fire-polished surface having a root-mean-squared roughness of at most 5 nanometers, and wherein the amount of PbO in the thin glass is lower than 1000 ppm.

2. The thin glass according to claim 1, further comprising the following components in % by weight:

|  | from | to |
|---|---|---|
| $SiO_2$ | 20 | 52 |
| $B_2O_3$ | 0 | 17 |
| $Na_2O$ | 0 | 11 |
| K2O | 0 | 15 |
| MgO | 0 | 5 |
| CaO | 0 | 15 |
| SrO | 0 | 1 |
| BaO | 2 | 14.5 |
| ZnO | 0 | 6 |
| $TiO_2$ | >12 | 32 |
| $ZrO_2$ | 0 | 7 |
| $Nb_2O_5$ | 0.5 | 26 |
| $La_2O_3$ | 0 | 7 |
| $Ta_2O_5$ | 0 | 8 and |
| $GeO_2$ | 0 | 8. |

3. The thin glass according to claim 1, further comprising a sum of the contents of BaO, SrO, CaO, MgO and ZnO that is at most 15% by weight.

4. The thin glass according to claim 1, wherein the content of $Nb_2O_5$ is at least 1% by weight.

5. The thin glass according to claim 1, further comprising a sum of the contents of $SiO_2$ and $B_2O_3$ that is at least 30 and at most 40% by weight.

6. The thin glass according to claim 1, further comprising the following components in % by weight:

|  | from | to |
|---|---|---|
| $SiO_2$ | 25 | 50 |
| BaO | 5 | 14.5 |
| $TiO_2$ | 15 | 30 |
| $Nb_2O_5$ | 2 | 15 |
| $Na_2O$ | 5 | 11 |
| $K_2O$ | 1 | 10 and |
| CaO | 0.5 | 5. |

7. The thin glass according to claim 1, wherein the thin glass is suitable for use a substrate or superstrate.

8. A layer composite comprising:
at least one semiconductor layer, and
a thin glass having a refractive index of higher than 1.60, the thin glass comprising the following components in % by weight:

|  | From | to |
|---|---|---|
| $SiO_2$ | 20 | 52 |
| BaO | 2 | 14.5 |
| $TiO_2$ | >12 | 32 |
| $Nb_2O_5$ | 0.5 | 26 |
| $Na_2O$ | 0 | 11 |
| SrO | 0 | 1, | wherein the thin glass has a thickness of lower than 2 millimeters and comprises at least one fire-polished surface having a root-mean-squared roughness of at most 5 nanometers, and wherein the amount of PbO in the thin glass is lower than 1000 ppm.

9. The layer composite according to claim 8, wherein the layer composite is an OLED.

10. A method for the production of a thin glass having a refractive index of higher than 1.60, comprising the steps:
melting of a glass mixture to form a glass melt or a glass obtained from the glass melt, the glass mixture comprising the following components in % by weight

|  | from | to |
|---|---|---|
| $SiO_2$ | 20 | 52 |
| BaO | 2 | 14.5 |
| $TiO_2$ | >12 | 32 |
| $Nb_2O_5$ | 0.5 | 26 |
| $Na_2O$ | 0 | 11 |
| SrO | 0 | 1, and | processing the glass melt or the glass obtained from the glass melt into the thin glass, wherein the thin glass has a thickness of lower than 2 millimeters and comprises at least one fire-polished surface having a root-mean-squared roughness of at most 5 nanometers, and wherein the amount of PbO in the thin glass is lower than 1000 ppm.

11. The according to claim 1, wherein the at least one fire-polished surface has a root-mean-squared roughness of at most 3 nanometers.

12. The thin glass according to claim 1, wherein the at least one fire-polished surface has a root-mean-squared roughness of at most 1 nanometers.

13. The thin glass according to claim 1, wherein the thin glass has a thickness of at most 0.2 millimeters.

14. The thin glass according to claim 1, wherein the amount of $WO_3$ in the thin glass is lower than 1000 ppm.

* * * * *